(12) United States Patent
Basin et al.

(10) Patent No.: US 8,232,117 B2
(45) Date of Patent: Jul. 31, 2012

(54) LED WAFER WITH LAMINATED PHOSPHOR LAYER

(75) Inventors: Grigoriy Basin, San Francisco, CA (US); Paul S. Martin, Singapore (SG)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 19 days.

(21) Appl. No.: 12/771,809

(22) Filed: Apr. 30, 2010

(65) Prior Publication Data

US 2011/0266569 A1    Nov. 3, 2011

(51) Int. Cl.
*H01L 21/00*    (2006.01)
(52) U.S. Cl. ......................................................... 438/21
(58) Field of Classification Search .................. None
See application file for complete search history.

(56) References Cited

U.S. PATENT DOCUMENTS

| | | | |
|---|---|---|---|
| 7,344,952 B2 * | 3/2008 | Chandra | 438/328 |
| 7,824,941 B2 * | 11/2010 | Braune et al. | 438/33 |
| 2004/0061433 A1 * | 4/2004 | Izuno et al. | 313/498 |
| 2004/0113230 A1 * | 6/2004 | Divakaruni et al. | 257/510 |
| 2005/0130390 A1 * | 6/2005 | Andrews et al. | 438/458 |
| 2005/0151147 A1 | 7/2005 | Izuno et al. | |
| 2005/0214963 A1 * | 9/2005 | Daniels et al. | 438/29 |
| 2007/0212854 A1 * | 9/2007 | Chu et al. | 438/464 |
| 2008/0173884 A1 | 7/2008 | Chitnis | |
| 2008/0225549 A1 * | 9/2008 | Dassanayake et al. | 362/554 |
| 2009/0093075 A1 | 4/2009 | Chu | |
| 2009/0140272 A1 * | 6/2009 | Beeson et al. | 257/89 |
| 2009/0173958 A1 | 7/2009 | Chakraborty | |
| 2009/0179207 A1 | 7/2009 | Chitnis | |
| 2010/0019260 A1 | 1/2010 | Epler | |
| 2010/0123171 A1 * | 5/2010 | Yang et al. | 257/272 |
| 2010/0151643 A1 * | 6/2010 | Hirler | 438/270 |

FOREIGN PATENT DOCUMENTS

| | | |
|---|---|---|
| WO | 2005029599 A2 | 3/2005 |
| WO | 2009126272 A1 | 10/2009 |

* cited by examiner

*Primary Examiner* — Charles Garber
*Assistant Examiner* — Andre' C Stevenson

(57) ABSTRACT

An LED wafer with a growth substrate is attached to a carrier substrate by, for example, a heat-releasable adhesive so that the LED layers are sandwiched between the two substrates. The growth substrate is then removed, such as by laser lift-off. The exposed surface of the LED layers is then etched to improve light extraction. A preformed phosphor sheet, matched to the LEDs, is then affixed to the exposed LED layer. The phosphor sheet, LED layers, and, optionally, the carrier substrate are then diced to separate the LEDs. The LED dice are released from the carrier substrate by heat or other means, and the individual LED dice are mounted on a submount wafer using a pick-and-place machine. The submount wafer is then diced to produce individual LEDs. The active layer may generate blue light, and the blue light and phosphor light may generate white light having a predefined white point.

15 Claims, 3 Drawing Sheets

LED WAFER WITH LAMINATED PHOSPHOR LAYER

FIELD OF THE INVENTION

This invention relates to light emitting diodes (LEDs) with an overlying layer of phosphor to wavelength-convert the LED emission and, in particular, to a technique of laminating a phosphor layer over the LEDS.

BACKGROUND

Prior art FIG. 1 illustrates a conventional flip chip LED die 10 mounted on a portion of a submount wafer 12. In a flip-chip, both the n and p contacts are formed on the same side of the LED die.

The LED die 10 is formed of semiconductor epitaxial layers, including an n-layer 14, an active layer 15, and a p-layer 16, grown on a growth substrate, such as a sapphire substrate. The growth substrate has been removed in FIG. 1 by laser lift-off, etching, grinding, or by other techniques. In one example, the epitaxial layers are GaN based, and the active layer 15 emits blue light. LED dies that emit UV light are also applicable to the present invention.

A metal electrode 18 electrically contacts the p-layer 16, and a metal electrode 20 electrically contacts the n-layer 14. In one example, the electrodes 18 and 20 are gold pads that are ultrasonically welded to anode and cathode metal pads 22 and 24 on a ceramic submount wafer 12. The submount wafer 12 has conductive vias 24 leading to bottom metal pads 26 and 28 for bonding to a printed circuit board. Many LEDs are mounted on the submount wafer 12 and will be later singulated to form individual LEDs/submounts.

Further details of LEDs can be found in the assignee's U.S. Pat. Nos. 6,649,440 and 6,274,399, and U.S. Patent Publications US 2006/0281203 A1 and 2005/0269582 A1, all incorporated herein by reference.

While an array of LED dies 10 are mounted on the submount wafer 12 or after the wafer 12 is diced, it is well known to deposit a phosphor over each LED die to generate any desired light color. To produce white light using the blue LED die 10, it is well known to deposit a YAG phosphor, or red and green phosphors, directly over the die 10 by, for example, spraying or spin-coating the phosphor in a binder, electrophoresis, applying the phosphor in a reflective cup, or other means. It is also known to affix a preformed tile of phosphor (e.g., a sintered phosphor powder or phosphor powder in a binder) on the top of the LED die 10. Blue light leaking through the phosphor, combined with the phosphor light, produces white light. Problems with creating the phosphor layer over the LED die 10 include the difficulty in creating very uniform phosphor layer thicknesses and densities. Any variation in the thickness or density will result in color non-uniformity over the surface of the LED die. A preformed tile of phosphor may be made more uniform and allows color testing of the tile prior to affixing it to the LED die; however, it is difficult and time-consuming to precisely affix each tile (e.g., 1 mm$^2$) to the top surface of an LED die 10.

Additionally, if a phosphor layer is deposited over all the LED dies 10 while the LED dies 10 are mounted on the submount wafer 12, prior to dicing the wafer 12, much of the phosphor will be wasted since it would be deposited on portions of the wafer 12 in-between the LED dies 10.

What is needed is a technique to create a phosphor layer over an LED die that does not suffer from the drawbacks of the prior art.

SUMMARY

In one embodiment of the invention, LED layers are grown over a growth substrate, such as sapphire, SiC, GaN, spinel, or other known substrate, to form an LED wafer. The type of substrate used depends on the type of LEDs to be formed. The n and p-layers are contacted by cathode and anode metal electrodes so as to create perhaps thousands of LEDs on a single substrate wafer.

The surface of the LED wafer, prior to dicing, is adhesively fixed to a flat carrier substrate, such as by a releasable adhesive. Suitable releasable adhesives include those releasable by UV, heat, or a solvent. The LED layers are now sandwiched between the growth substrate and the carrier substrate. The carrier substrate may be a silicon wafer with an adhesive layer. Other carrier substrates include those composed of metal, glass, plastic, or any other suitable material.

The growth substrate is then removed, while the carrier substrate provides mechanical support. In one example, the growth substrate is sapphire, the LED layers are GaN layers optionally containing Al and In, and the sapphire substrate can be removed by laser lift-off.

The exposed surface of the LED layers can be thinned and roughened, such as by etching or a combination of processes, to increase light extraction and remove damage caused by the laser lift-off.

A preformed phosphor sheet approximately the size of the entire LED wafer is then affixed over the exposed surface of the LED layers. The LEDs making up the LED layers form a continuous surface since they have not been diced, so there is little waste of phosphor. The phosphor sheet may be pretested and selected to match the particular color characteristics of the LEDs on the wafer. In one embodiment, the phosphor sheet is somewhat flexible and comprises phosphor powder infused in a silicone binder. The phosphor sheet may be affixed to the LED layer surface using a thin layer of silicone.

In one embodiment, the phosphor sheet contains a YAG phosphor (yellow-green). In another embodiment, the phosphor sheet contains mixed red and green phosphors. In another embodiment, the phosphor sheet comprises multiple layers, such as a layer of red and a separate layer of YAG to produce a warm white color. The process can be used to make any color light using any type of phosphor.

The bottom surface of the carrier substrate may then be affixed to a tacky, stretchable sheet. Support surfaces other than a stretchable sheet may be used instead.

The phosphor sheet, LED layers, and carrier substrate are then diced (e.g., by sawing) to separate out the LEDs. The stretchable sheet may then be pulled in the x and y directions to physically separate the LEDs by a predetermined distance. Alternately, the phosphor sheet and LED layers may be singulated on the carrier substrate (e.g., by sawing) without the carrier substrate being singulated. In such a case, the stretchable sheet is not necessary.

The carrier substrate is then subjected to UV, heat, or a solvent to release the LED dice from the carrier substrate (whether or not the carrier substrate is diced).

An automatic pick and place machine then removes each LED die and mounts the die to a submount wafer. The LED die metal electrodes may be bonded to the submount wafer metal electrodes by ultrasonic bonding. Further processing may be performed on the LED dies while mounted on the submount wafer, such as forming a lens over each die. The submount wafer is then diced.

Accordingly, any phosphor waste is minimized, and it is straight forward to affix the phosphor sheet to the LED wafer. After dicing, the phosphor layer over each LED die is inherently aligned with the edges of the LED die. The phosphor layer may be uniformly thick and may have a substantially uniform density of phosphor. The resulting phosphor layer can be matched for each LED wafer so that the resulting color (e.g., white point) meets a target color. This can be important for applications where many identical LEDs are needed, such as for backlighting a large LCD television.

The LEDs may be flip-chips, or have top and bottom electrodes, or have top electrodes only.

BRIEF DESCRIPTION OF THE DRAWINGS

Elements that are the same or equivalent are labeled with the same numeral.

DETAILED DESCRIPTION

Figure 1:
FIG. 1 is a cross-sectional view of a prior art blue or UV flip-chip LED die, mounted on a submount.
Figure 2:
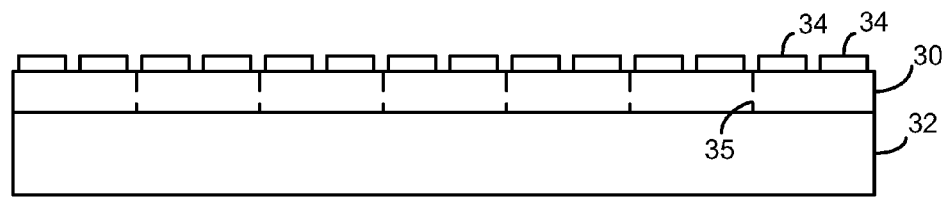
FIG. 2 is a cross-sectional view of an LED wafer comprising LED layers, grown on a growth substrate, and metal electrodes formed to contact the n and p-layers at each LED location.

FIG. 2 illustrates LED layers 30 grown over a growth substrate 32. In one embodiment, the LEDs emit blue or UV light and are formed by epitaxial GaN layers, such as shown in FIG. 1. The substrate 32 may be sapphire, GaN, SiC, or other suitable growth substrate. The substrate 32 is typically a circular wafer. Metal electrodes 34 are formed in electrical contact with the n and p LED layers for each LED die area. The metal electrodes 34 may be similar to the electrodes 18 and 20 in FIG. 1.

In another embodiment, the LEDs are not flip-chips but may have top and bottom electrodes or top electrodes only.

The boundaries between LEDs are shown by dashed lines 35, where the LED wafer will be later sawed or scribed and broken.

Figure 3:
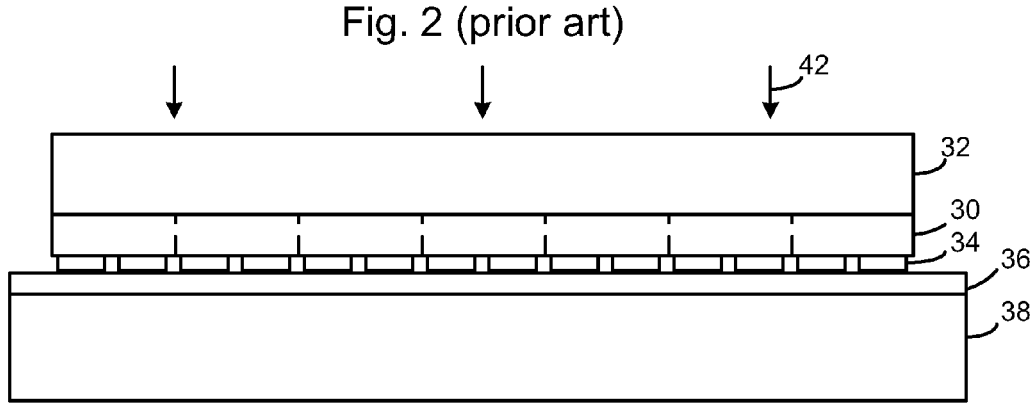
FIG. 3 illustrates the structure of FIG. 2 being affixed to a carrier substrate and the growth substrate being removed using laser lift-off.

In FIG. 3, the metal electrodes 34 are affixed to an adhesive layer 36 on a carrier substrate 38. The carrier substrate 38 may be silicon since a silicon wafer can be made very flat and is relatively inexpensive. The adhesive layer 36 is preferably a non-tacky material that softens when heated to adhere to the metal electrodes 34. Upon reheating the adhesive layer 36, the metal electrodes 34 will be released. Such adhesives are well known. The carrier substrate 38 should be at least as large as the growth substrate 32.

After the LED wafer is affixed to the carrier substrate 38, so that there is good mechanical support for the thin LED wafer, the top surface of the GaN LED layers is exposed to pulses of excimer laser light 42 through the transparent growth substrate 32. The laser light causes the surface GaN molecules to break down, and the gas released forces the growth substrate 32 off the LED layers 30. The growth substrate 32 is then easily taken off the LED layers 30. Such a laser lift-off process is well known.

Figure 4:
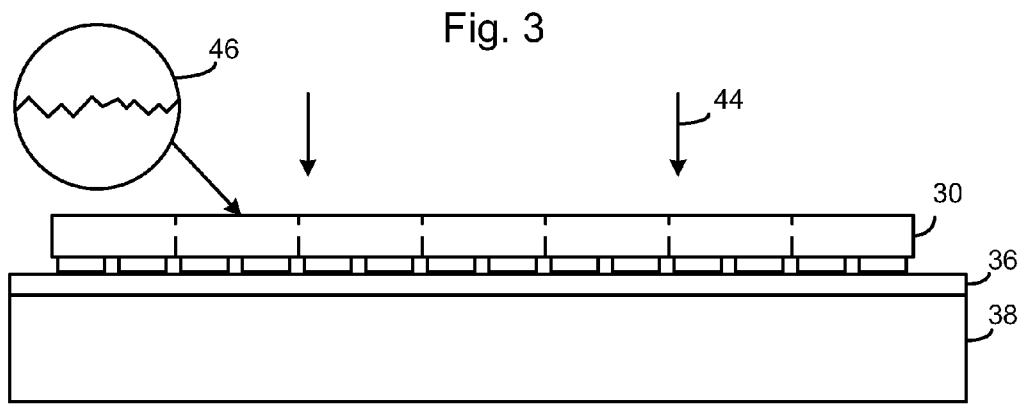
FIG. 4 illustrates the exposed LED layer being thinned and roughened for improving light extraction.

In FIG. 4, the exposed surface of the LED layers 30 is thinned and roughened such as by reactive ion etching 44 or other suitable process. The LED layers 30 may instead be first thinned by mechanical polishing followed by an etching process to roughen the surface to achieve a controlled degree of roughness. The thinning removes portions that have been damaged by the laser lift-off and improves light extraction. Roughening the surface reduces internal reflections and further improves light extraction. A simplified magnified portion 46 of the LED surface is shown in FIG. 4.

Figure 5:
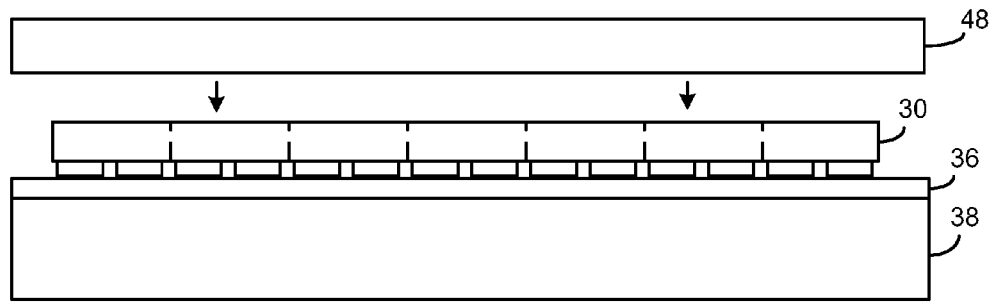
FIG. 5 illustrates a preformed, color-matched phosphor sheet being affixed to the LED wafer.

A phosphor sheet is separately formed. FIG. 5 illustrates the preformed phosphor sheet 48. If white light is to be produced by the resulting LED, and the LED active layer emits blue light, the phosphor sheet 48 may be formed of one or more phosphors that emit red and green light when excited by blue light, and the phosphor layer must be thin enough or of sufficient low density to allow some blue light to pass through and combine with the red and green components. Suitable phosphors include a YAG phosphor (produces yellow-green light), combinations of red and green phosphors, or a combination of a YAG phosphor with a red phosphor to produce a warmer white light. If the LED generates UV light, a blue phosphor may also be included in the phosphor sheet 48.

In one embodiment, to create the phosphor sheet 48, the phosphor powder is mixed with silicone to achieve a target phosphor density, and the phosphor sheet 48 is formed to have a target thickness. The desired thickness may be obtaining by spinning the mixture on a flat surface or molding the phosphor sheet. Alternatively, the phosphor sheet 48 may be sawed from an elongated boule of phosphor to the desired thickness. In another embodiment, the phosphor sheet 48 is formed of sintered phosphor powder and may be sawed from a boule of sintered phosphor.

After the phosphor sheet 48 is formed, the phosphor sheet 48 may be tested by energizing the phosphor sheet 48 using a blue light source and measuring the light emission. Since blue LEDs in different wafers generally emit slightly different dominant wavelengths, the blue LEDs may be tested while part of the LED wafer. Preformed phosphor sheets of varying thicknesses or phosphor densities are then matched up with particular LED wafers so that the resulting color emissions may all have the same target white point (or CCT). Producing LEDs that output substantially identical white points is particularly valuable for applications that require matched LEDs such as for backlighting a large LCD television.

In one embodiment, the phosphor sheet 48 is on the order of a few hundred microns thick and somewhat flexible. The phosphor sheet 48 is preferably the same size as the LED wafer or larger.

As shown in FIG. 5, the matched phosphor sheet 48 is placed over the LED layers 30, and a vacuum can be drawn between the phosphor sheet 48 and the LED layers 30 to remove all air. The phosphor sheet 48 can then be laminated to the LED layers 30 using heat and pressure (assuming there is sufficient silicone in the phosphor sheet 48). This will conform the phosphor sheet 48 to the top surface of the LED layers 30. For a phosphor sheet 48 not containing an appropriate type of silicone or for a sintered phosphor sheet 48, a thin layer of silicone is applied over the LED layers 30 or phosphor sheet 48 to act as an adhesive for laminating the phosphor sheet 48 to the LED layers 30 using pressure. The silicone may be cured by heat or UV.

By laminating a preformed phosphor sheet onto the LED layer 30 prior to the LEDs being diced, at least the following advantages result: 1) there is little wasted phosphor since almost all the phosphor coats an LED; 2) the phosphor over each LED may have a uniform thickness and density; 3) it is fairly easy to properly position the phosphor sheet over the LED wafer and affix it to the LED wafer; 4) the phosphor sheet may be color-matched to the particular LED color emission; 5) when the LEDs are diced, the phosphor layer will precisely align with the edges of the LED to produce uniform color; and 6) the phosphor sheet may be formed of multiple layers, each layer being customized and precisely formed. In one embodiment, a multi-layer phosphor sheet is preformed by lamination, and the sheet is tested and then laminated as a single sheet to the LED layers 30. Alternatively, the multiple layers may be individually laminated over the LED layers 30. The multiple layers may be a YAG layer and a red phosphor layer.

Figure 6:
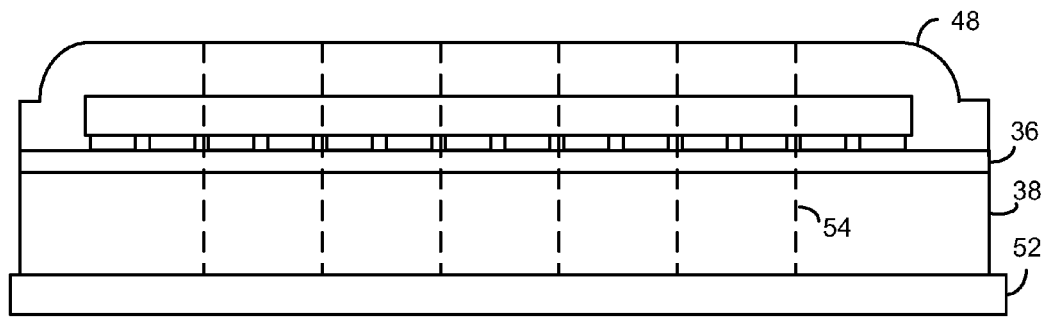
FIG. 6 illustrates the carrier substrate being affixed to a tacky stretchable sheet and illustrates the dicing boundaries between the LEDs.

FIG. 6 illustrates the phosphor sheet 48 (assuming it is somewhat flexible) conforming over the surface of the LED layers 30 and carrier substrate 38. In FIG. 6, the bottom surface of the carrier substrate 38 is affixed to a tacky stretchable sheet 52. This may be done before or after the phosphor sheet 48 is affixed to the LED layers 30. A suitable stretchable sheet 52 is commercially available for supporting dice during the dicing process. Support structures other than a stretchable sheet may also be used.

The phosphor sheet 48, LED layers 30, adhesive layer 36, and carrier substrate 38 are then diced along the dashed lines 54 by any suitable technique. If the metal electrodes 34 extend to the edges of each LED, the metal electrodes 34 are also separated by the dicing process. The stretchable sheet 52 may be flexed over a curved surface to break the carrier substrate 38 after the carrier substrate 38 is partially sawed.

Figure 7:
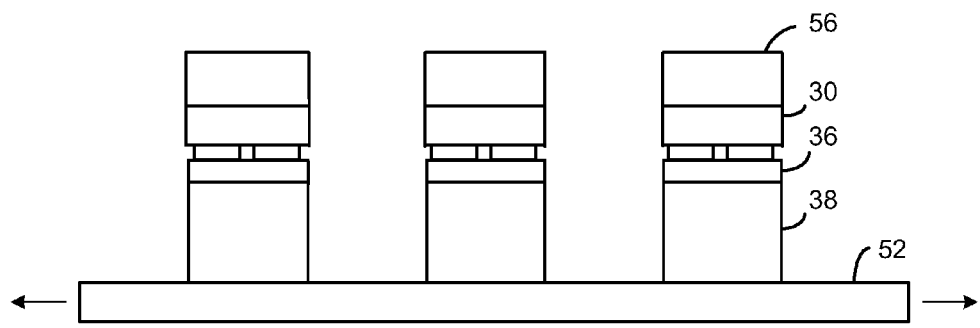
FIG. 7 illustrates the LEDs after dicing and the stretchable sheet stretched in the x and y directions to separate the LEDs for a pick and place machine. The adhesive on the carrier substrate is heated to release the LEDs from the carrier substrate.

As shown in FIG. 7, the stretchable sheet 52 is stretched in the x and y directions to separate the LEDs by a predetermined amount. Note that the phosphor layer 56 (separated from the phosphor sheet 48) is inherently aligned with the edges of the LED die 58. Therefore, the resulting light emission will be substantially uniform.

Figure 8:
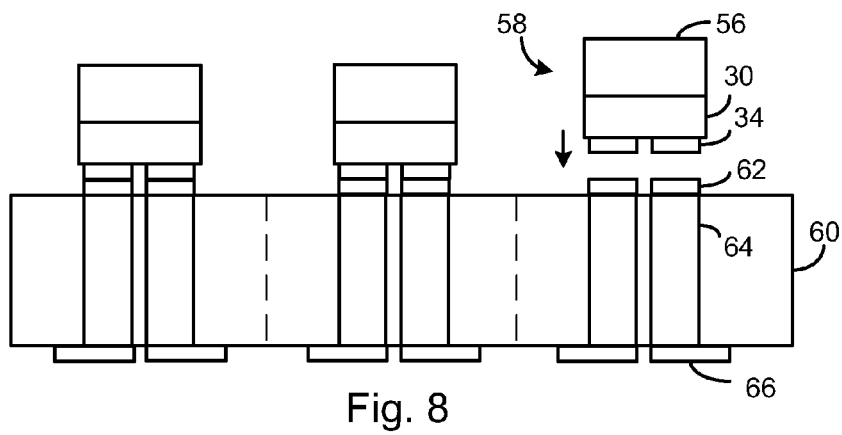
FIG. 8 illustrates the LEDs being mounted on a submount wafer.

The structure is then heated by, for example, an infrared lamp, to release the metal electrodes 34 from the adhesive layer 36, and the structure is accessed by a pick-and-place machine programmed to automatically remove each LED die 58, shown in FIG. 8, and mount the LED die 58 on a submount wafer 60.

In another embodiment, the carrier substrate 38 is not singulated, and the sawing is only through the phosphor sheet 48 and LED layers 30. The adhesive layer 36 is then released from the diced LED layers 30 using UV, heat, etc. The pick-and-place machine can then remove each LED die individually from the carrier substrate 38. In such an embodiment, there is no need to mount the carrier substrate on the stretchable sheet 52.

FIG. 8 shows the submount wafer 60 having top metal electrodes 62 matched to the LED's electrodes 34. The bonding may be by ultrasonic welding or other technique. The submount wafer 60 may be ceramic and have metal vias 64 that lead to bottom electrodes 66 for attachment to a printed circuit board.

Figure 9:
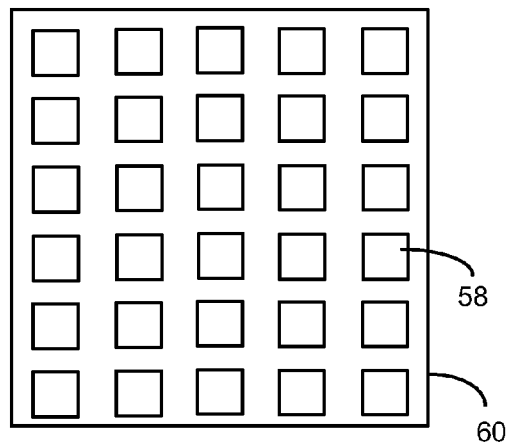
FIG. 9 is a top down view of the submount wafer after being populated with an array of LEDs. Lenses may be formed over the LEDs while on the submount wafer.

FIG. 9 is a top down view of the submount wafer 60 after being populated with an array of LED dice 58. A lens may be formed over each LED die 58 while on the submount wafer 60.

Figure 10:
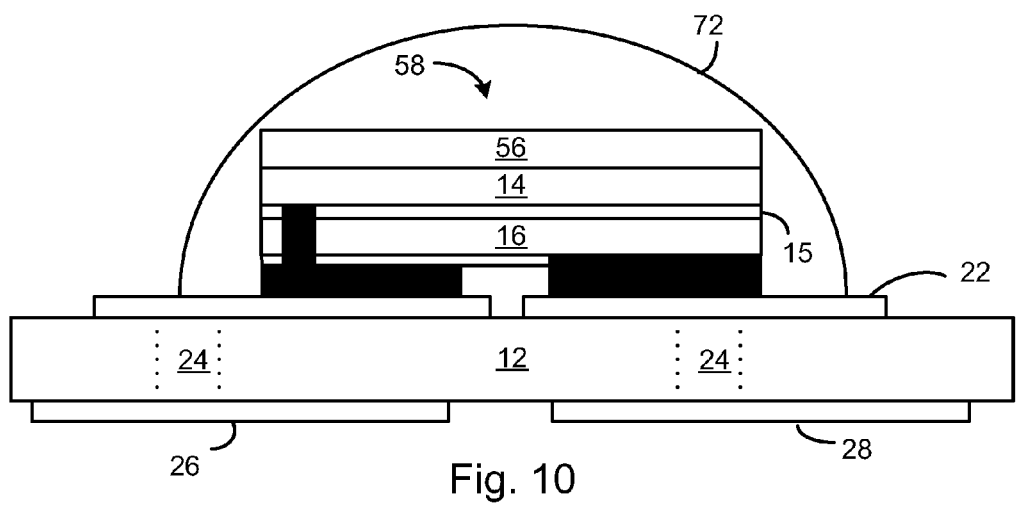
FIG. 10 is a cross-sectional view of a single LED and submount after dicing the submount wafer and after the LED and phosphor are encapsulated by a silicone lens.

FIG. 10 is a cross-sectional view of a single LED die 58 and submount 12 after dicing the submount wafer 60 and after the LED die 58 and phosphor layer 56 are encapsulated by a silicone lens 72. The LED can be other than a flip-chip LED and may be formed of any suitable material.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for fabricating a light emitting diode (LED) device comprising:
    growing LED layers on a growth substrate;
    providing a preformed phosphor sheet separate from the LED layers;
    affixing the LED layers to a carrier substrate using a releasable adhesive;
    removing the growth substrate while the carrier substrate provides mechanical support for the LED layers;
    laminating the preformed phosphor sheet to an exposed surface of the LED layers;
    dicing the phosphor sheet and the LED layers to create separate LED dice, each having an overlying phosphor layer;
    releasing the LED layers from the releasable adhesive; and
    removing the LED dice from the carrier substrate.

2. The method of claim 1 wherein the LED layers comprise an n-layer and a p-layer, the method further comprising forming metal electrodes contacting the n-layer and the p-layer prior to affixing the LED layers to the carrier substrate.

3. The method of claim 2 wherein affixing the LED layers to the carrier substrate comprises affixing at least some of the metal electrodes to the carrier substrate.

4. The method of claim 1 wherein the LED layers emit blue light when energized, and the phosphor sheet emits red light wavelengths and green light wavelengths when energized by the blue light, such that the LED dice emit white light when the LED dice are energized.

5. The method of claim 4 wherein the phosphor sheet comprises a YAG phosphor.

6. The method of claim 1 wherein the phosphor sheet has an area approximately the same as or larger than an area of the growth substrate.

7. The method of claim 1 wherein the phosphor sheet has a substantially uniform thickness.

8. The method of claim 1 further comprising mounting the carrier substrate on an adhesive sheet, and wherein dicing the phosphor sheet and the LED layers comprises also dicing the carrier substrate but not the adhesive sheet.

9. The method of claim 1 wherein removing the growth substrate comprises removing the growth substrate using a laser lift-off process.

10. The method of claim 1 wherein the releasable adhesive comprises an adhesive releasable by at least one of UV light, heat, or a solvent.

11. The method of claim 1 further comprising mounting the LED dice on a submount wafer by bonding electrodes on the submount wafer to corresponding electrodes of the LED dice.

12. The method of claim 1 further comprising using a pick-and-place machine to remove the LED dice individually from the carrier substrate.

13. A light emitting diode (LED) structure comprising:
an LED wafer, including a growth substrate, the LED wafer having a first surface;
a carrier substrate affixed to the first surface by a releasable adhesive, wherein the growth substrate is removed from the LED wafer, the LED wafer having a second surface opposite to the first surface; and
a preformed phosphor sheet, formed separate from the LED wafer, affixed to the second surface of the LED wafer,
wherein the phosphor sheet and LED wafer are not yet diced.

14. The device of claim 13 further comprising the carrier substrate being affixed to a stretchable sheet for supporting the phosphor sheet, the LED wafer, and the carrier substrate after dicing of the phosphor sheet, the LED wafer, and the carrier substrate.

15. The device of claim 13 wherein the LED wafer comprises an n-layer and a p-layer, the LED wafer further comprising metal electrodes contacting at least the p-layer, the carrier substrate being affixed to the metal electrodes by the releasable adhesive.

* * * * *